United States Patent [19]

DiMarco et al.

[11] Patent Number: 5,289,415
[45] Date of Patent: Feb. 22, 1994

[54] SENSE AMPLIFIER AND LATCHING CIRCUIT FOR AN SRAM

[75] Inventors: David P. DiMarco, Chandler; James W. Nicholes, Gilbert; Douglas D. Smith, Mesa, all of Ariz.

[73] Assignee: Motorola, Inc., Schaumburg, Ill.

[21] Appl. No.: 870,074

[22] Filed: Apr. 17, 1992

[51] Int. Cl.⁵ .................... G11C 7/00; G11C 7/02; G11C 11/00
[52] U.S. Cl. .................... 365/190; 365/154; 365/203; 365/208
[58] Field of Search ............... 365/190, 203, 207, 154, 365/208

[56] References Cited

U.S. PATENT DOCUMENTS

| | | | |
|---|---|---|---|
| 4,542,483 | 9/1985 | Procyk | 365/190 |
| 4,750,155 | 6/1988 | Hsieh | 365/154 |
| 4,954,992 | 9/1990 | Kumanoya et al. | 365/207 |
| 5,007,024 | 4/1991 | Tanaka et al. | 365/207 |
| 5,065,363 | 11/1991 | Sato et al. | 365/154 |
| 5,126,974 | 6/1992 | Sasaki et al. | 365/207 |
| 5,153,459 | 10/1992 | Park et al. | 365/190 |

*Primary Examiner*—Eugene R. LaRoche
*Assistant Examiner*—Michael C. Kessell
*Attorney, Agent, or Firm*—Robert D. Atkins

[57] ABSTRACT

A memory circuit uses sense amplifiers to amplify a low level differential data signal from the memory cells to full logic levels. A first sense amplifier converts the low level differential data signal to an intermediate differential voltage level at first and second nodes during the read cycle. A second sense amplifier converts the intermediate differential voltage level to the full logic level. The first and second sense amplifiers are powered down after sensing is complete. A circuit drives the intermediate differential data signal to an equilibrium voltage level when the sensing is complete to reduce the power up delay time of the second sense amplifier and thereby increase the operating speed of the memory circuit. A latching circuit is synchronized with the power down of the first sense amplifier to latch the output logic level at the end of the read cycle.

19 Claims, 1 Drawing Sheet

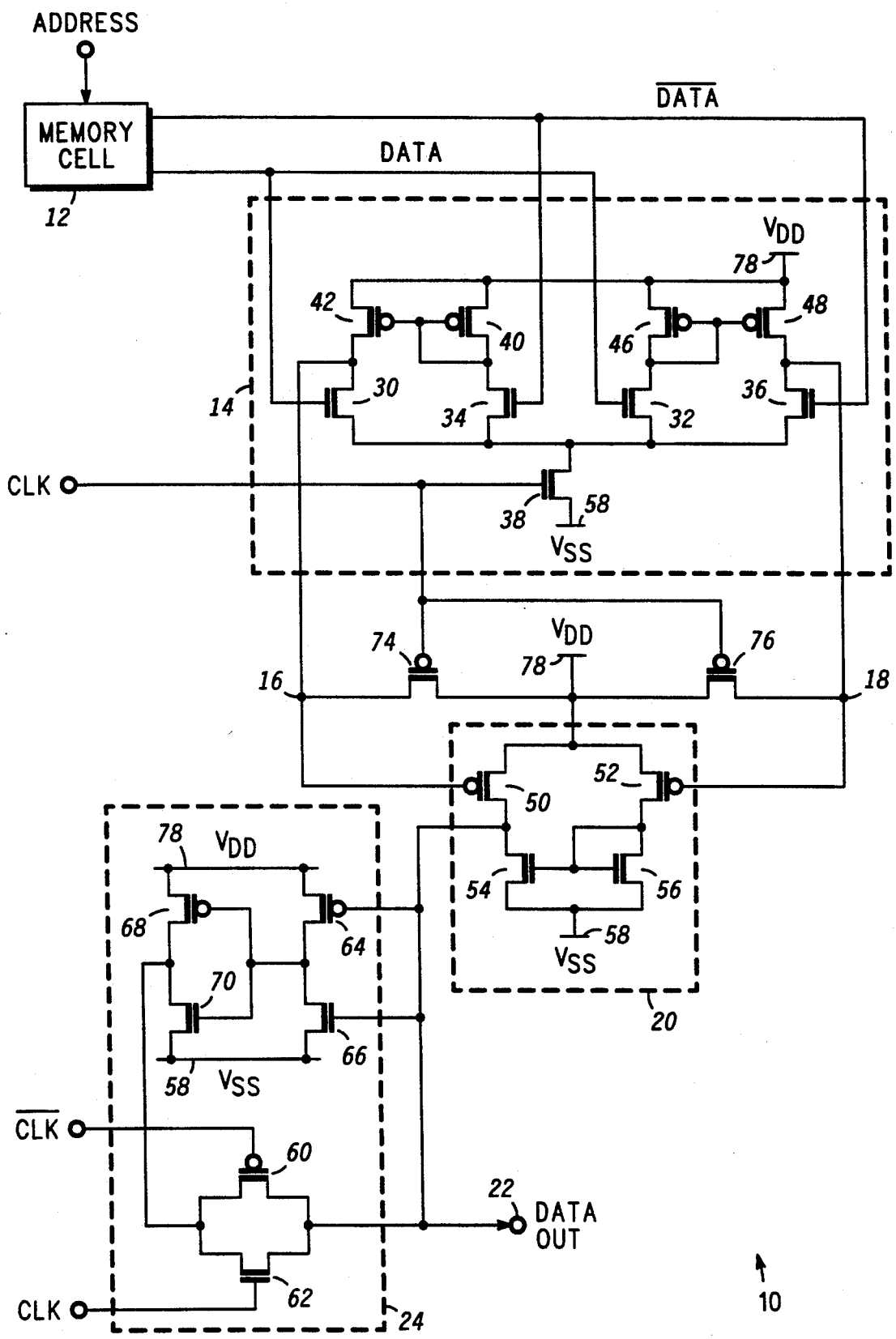

SENSE AMPLIFIER AND LATCHING CIRCUIT FOR AN SRAM

BACKGROUND OF THE INVENTION

The present invention relates in general to random access memory and, more particularly, to a static random access memory (SRAM) with sense amplifiers and latching circuit.

An SRAM is commonly used for storing digital data which can be retrieved and latched at one or more output ports in response to an address signal. When a particular data cell of the SRAM is addressed, a differential data signal of say 100 millivolts (mv) is developed which must be amplified to conventional logic levels for use by other circuitry. This can be achieved with sense amplifiers coupled to the data cell columns for amplifying the low level differential data signal. A first sense amplifier may convert the 100 mv differential data signal from the data cell to a 4.5 volt and 1.5 volt intermediate differential signals, while a second sense amplifier converts the intermediate differential signals to 0.0 volt and 5.0 volt logic levels.

Sense amplifiers in prior art SRAMs consume an appreciable amount of power when active. The power consumption can be unacceptably high in wide-word and multiport applications where a significant number of sense amplifiers are active simultaneously. Therefore, in order to reduce the power consumption, the digital data is latched at the output port of the SRAM and the sense amplifiers are powered down after sensing and amplification are complete. The sense amplifiers are powered down approximately 50% of the read cycle and 100% of the write cycle.

Conventional sense amplifier designs have a problem with read cycle delay following power-down where the first stage sense amplifier outputs end up at voltage levels not compatible with the second stage sense amplifier. When the first stage sense amplifier is powered down, its outputs are weakly driven towards the positive power supply $V_{DD}$ at different rates. Thus, at the beginning of the read cycle, the voltage levels of the intermediate differential signals at the inputs of the second stage sense amplifier are unknown. The intermediate signal going high (4.5 volts) during the read cycle has less drive capacity and requires more time to transition to steady state than the intermediate signal going low (1.5 volts). Therefore, the transitions to the data signal experience a push-out delay to allow time for the positive going intermediate signal to reach a steady state high (4.5 volts) regardless of its starting position (worse case 0.0 volts). The push-out delay necessary to compensate for the worse case rise time slows the operating speed of the SRAM.

Several types of latching circuits are used in the prior art each with its own disadvantages. One latching circuit is a cross-coupled latch activated by a clock signal a predetermined time after the differential data signal from the memory cell is developed. The latching circuit requires critical timing for the clock signal. If the latch is activated too soon, the data may not be valid yet and incorrect data is latched. Alternately, if the latch is activated too late, the read access time is delayed thereby reducing the overall performance of the SRAM. Another type of latching circuit must be over-driven by the second stage sense amplifier resulting in a delay of the read access time.

Hence, a need exists for an SRAM with a first sense amplifier that does not degrade read performance after power down, and a latching circuit that does not require a critically-timed activation clock or have to be over-driven by the second sense amplifier resulting in a read delay.

SUMMARY OF THE INVENTION

Briefly stated, the invention comprises a memory cell responsive to an address signal for retrieving a differential data signal. An amplifier includes first and second inputs coupled for receiving the differential data signal and first and second outputs for providing an amplified differential data signal at first and second nodes. The first amplifier operates during a first state of a first clock signal applied at an enable input. A circuit is coupled to the first and second nodes for driving the amplified differential data signal to an equilibrium voltage level at the first and second nodes during a second state of the first clock signal. A differential to single-ended converter includes a first input coupled to the first node, a second input coupled to the second node, and an output providing a digital output signal of the memory circuit.

In another aspect, the present invention is a memory circuit responsive to an address signal for retrieving a differential data signal comprising an amplifier having first and second inputs coupled for receiving the differential data signal and first and second outputs for providing an amplified differential data signal at first and second nodes. The first amplifier operates during a first state of a first clock signal applied at an enable input. A differential to single-ended converter includes a first input coupled to the first node, a second input coupled to the second node, and an output providing a digital output signal of the memory circuit. A latching circuit is coupled to the output of the differential to single-ended converter for latching the digital data signal in response to a second state of the first clock signal.

BRIEF DESCRIPTION OF THE DRAWING

The sole FIGURE is a schematic diagram illustrating the sense amplifiers and latching circuit of an SRAM.

DETAILED DESCRIPTION OF THE PREFERRED EMBODIMENT

An SRAM 10 is shown in the sole FIGURE suitable for manufacturing as an integrated circuit using conventional integrated circuit processes. Memory cell 12 provides differential data signals DATA and $\overline{\text{DATA}}$ with 100 mv separating logic zero and logic one. Sense amplifier 14 converts the 100 mv differential signals DATA and $\overline{\text{DATA}}$ to intermediate differential signals (4.5 and 1.5 volts) at nodes 16 and 18. Sense amplifier 20 converts the intermediate differential signals to 0.0 to 5.0 volt logic DATAOUT signal at output 22. Latching circuit 24 latches the DATAOUT signal in response to clock signals CLK and $\overline{\text{CLK}}$ as sense amplifiers 14 and 20 are powered down. Clock signals CLK and $\overline{\text{CLK}}$ operate with opposite phase.

At the beginning of the read cycle, an address signal activates memory cell 12 for developing the differential signals DATA and $\overline{\text{DATA}}$. The DATA signal is applied at the gates of transistors 30 and 32 of sense amplifier 14, while the $\overline{\text{DATA}}$ signal is applied at the gates of transistors 34 and 36. The CLK clock signal applied at an enable input of sense amplifier 14 becomes high at the beginning of the read cycle and activates transistor 38 operating as a current source for transistors 30–36. The sources of transistors 38, 54 and 56 are coupled to power supply conductor 58 operating at ground potential $V_{SS}$. The drain of transistor 34 is coupled to the drain of transistor 40 and to the gates of transistors 40 and 42 operating as a current mirror such that the differential signals DATA and $\overline{DATA}$ are amplified to a single-ended signal at node 16. Likewise, the differential signals DATA and $\overline{DATA}$ are amplified through the current mirror transistors 46 and 48 to a single-ended signal at node 18. The intermediate signals at nodes 16 and 18 operate differentially because the DATA and $\overline{DATA}$ signals are fed into opposite inputs of the differential to single-ended converters of sense amplifier 14.

For example, consider the DATA signal 100 mv more positive than the $\overline{DATA}$ signal from memory cell 12. Transistor 30 conducts more current than transistor 34 and the same current flowing through transistors 34 and 40 is mirrored through transistor 42. Transistor 30 sinks current from node 16 causing the potential at node 16 to fall to 1.5 volts. Similarly, transistor 32 conducts more current than transistor 36 and the current through transistors 32 and 46 is mirrored through transistor 48. Since transistors 36 cannot sink all the current supplied by transistor 48, the excess current increases the potential at node 18 to 4.5 volts.

The intermediate differential signals at nodes 16 and 18 drive p-channel transistors 50 and 52 of sense amplifier 20 which are amplified through current mirror transistors 54 and 56 to the DATAOUT logic signal (0.0 volts or 5.0 volts) at output 22. The lower potential at node 16 turns on transistor 50 more than the higher potential at node 18 turns on transistor 52. The current flow through transistor 52 is mirrored through transistors 54 and 56 and the DATAOUT signal at output 22 rises toward a 5.0 volt logic one level.

During the read cycle with the CLK clock signal high and the $\overline{CLK}$ clock signal low, the transmission gate formed of transistors 60 and 62 breaks the feedback path around the inverters formed by transistors 64 and 66 and transistors 68 and 70, respectively, and effectively removes latching circuit 24 from the circuit.

At the end of the read cycle the CLK clock signal goes low and turns off current source transistor 38 thereby disabling sense amplifier 14. At the same time, transistors 60 and 62 are enabled by the low CLK clock signal and the high $\overline{CLK}$ clock signal completing the feedback path between the output of inverting transistors 68-70 and the input of inverting transistors 64-66. The logic level of the DATAOUT signal is thus latched at output 22 by the even number of serial inverters coupled output to input in latching circuit 24.

A key feature of the present invention is the use of p-channel transistors 50 and 52 in sense amplifier 20 with nodes 16 and 18 set to a common mode logic high level via transistors 74 and 76 during the off-read cycle. The logic zero CLK clock signal enables transistors 74 and 76 to pull nodes 16 and 18 to the positive power supply potential $V_{DD}$, say 5.0 volts, from power supply conductor 78. The intermediate differential signals are thus set to a known equilibrium voltage level (nodes 16 and 18 at $V_{DD}$), resulting in a zero differential signal. The delay through sense amp 20 is determined in part by the voltage levels at nodes 16 and 18 at the beginning of the read cycle. Although nodes 16 and 18 tend to drift toward a $V_{DD}$ level by way of transistors 42 and 48 when sense amp 14 is powered down, enabling transistors 74 and 76 drives nodes 16 and 18 to $V_{DD}$ much more rapidly.

In the prior art, the intermediate signal going high (4.5 volts) during the read cycle has less drive capacity from the first sense amplifier and requires more time to transition to steady state high than the intermediate signal going low (1.5 volts). NMOS transistors like 30 and 36 have more gain and drive capacity than PMOS transistors like 42 and 48.

In the present invention, by positioning the intermediate differential signals at 5.0 volts during the off-read cycle, the time required to transition high is reduced because both the high going (4.5 volts) and low going (1.5 volts) intermediate signals are driving lower and there is more drive capacity in the negative going direction. Furthermore, the time required for the intermediate signal to go high (4.5 volts) is only the time necessary to transition from 5.0 volts to 4.5 volts. This eliminates the need for a push-out delay noted for the prior art. The delay of the low going intermediate signal is also known as the time to transition from 5.0 volts to 1.5 volts with the greater drive capacity of NMOS transistors 30 and 36. Without the push-out delay to compensate for the worse case rise time, the read cycle may be shortened thereby increasing the operating speed of SRAM 10. Furthermore, with transmission gate 60-62 disabled during the read cycle, sense amplifier 20 does not have to over-drive the feedback of inverting transistors 64-66 and 68-70 when driving the DATAOUT signal to the appropriate logic level.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

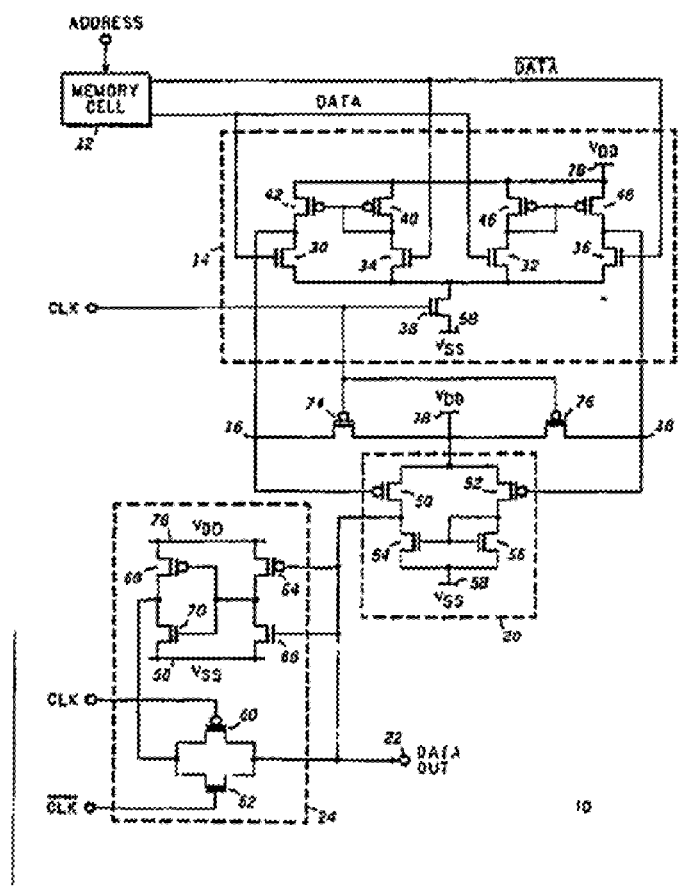

What is claimed is:

1. A memory circuit comprising:

a memory cell responsive to an address signal for retrieving a differential data signal;

an amplifier having first and second inputs coupled for receiving said differential data signal and having first and second outputs for providing an amplified differential data signal at first and second nodes, said first amplifier operating during a first state of a first clock signal applied at an enable input;

a first transistor having a gate, a drain and a source, said gate being coupled to said first node, said source being coupled to a first power supply conductor, said first transistor being formed as a p-channel transistor a second transistor having a gate, a drain and a source, said gate being coupled to said second node, said source being coupled to said first power supply conductor, said second transistor being formed as a p-channel transistor;

a third transistor having a gate, a drain and a source, said gate and drain being coupled together to said drain of said second transistor, said source being coupled to a second power supply conductor, said third transistor being formed as an n-channel transistor;

a fourth transistor having a gate, a drain and a source, said gate being coupled to said gate of said third transistor, said source being coupled to said second power supply conductor, said drain being coupled to said drain of said first transistor for providing a digital output signal, said fourth transistor being formed as an n-channel transistor;

a fifth transistor having a gate, a drain and a source, said gate receiving said first clock signal, said source being coupled to said first power supply conductor, said drain being coupled to said first node, said fifth transistor being formed as a p-channel transistor; and a sixth transistor having a gate, a drain and a source, said gate receiving said first clock signal, said source being coupled to said first power supply conductor, said drain being coupled to said second node, said sixth transistor being formed as a p-channel transistor.

2. The memory circuit of claim 1 wherein said amplifier includes:

a seventh transistor having a gate, a drain and a source, said drain being coupled to said first node;

an eighth transistor having a gate, a drain and a source, said gates of said seventh and eighth transistors receiving said differential data signal;

a ninth transistor having a gate, a drain and a source, said gate and drain being coupled together to said drain of said eighth transistor, said source being coupled to said first power supply conductor;

a tenth transistor having a gate, a drain and a source, said gate being coupled to said gate of said ninth transistor, said source being coupled to said first power supply conductor, said drain being coupled to said drain of said seventh transistor at said first node; and an eleventh transistor having a gate, a drain and a source, said gate receiving said first clock signal, said source being coupled to said second power supply conductor, said drain being coupled to said sources of said seventh and eighth transistors.

3. The memory circuit of claim 2 wherein said amplifier further includes:

a twelfth transistor having a gate, a drain and a source, said drain being coupled to said second node, said source being coupled to said drain of said eleventh transistor;

a thirteenth transistor having a gate, a drain and a source, said source being coupled to said drain of said eleventh transistor, said gate of said twelfth and thirteenth transistors receiving said differential data signal;

a fourteenth transistor having a gate, a drain and a source, said gate and drain being coupled together to said drain of said thirteenth transistor, said source being coupled to said first power supply conductor; and a fifteenth transistor having a gate, a drain and a source, said gate being coupled to said gate of said fourteenth transistor, said source being coupled to said first power supply conductor, said drain being coupled to said drain of said twelfth transistor at said second node.

4. The memory circuit of claim 1 further comprising a latching circuit having an input and an output, said input being coupled to said output of said differential to single-ended converter for latching said digital output signal in response to a second state of said first clock signal, said output being coupled to said output of said differential to single-ended converter for providing substantially zero delay in latching said digital output signal.

5. The memory circuit of claim 4 wherein said latching circuit includes:

a first transistor having a gate, a drain and a source, said gate being coupled to said output of said differential to single-ended converter, said source being coupled to a first power supply conductor;

a second transistor having a gate, a drain and a source, said gate being coupled to said gate of said first transistor, said drain being coupled to said drain of said first transistor, said source being coupled to a second power supply conductor;

a third transistor having a gate, a drain and a source, said gate being coupled to said drain of said first transistor, said source being coupled to said first power supply conductor;

a fourth transistor having a gate, a drain and a source, said gate being coupled to said gate of said third transistor, said drain being coupled to said drain of said third transistor, said source being coupled to said second power supply conductor; and a transmission gate coupled between said drain of said fourth transistor and said gate of said first transistor and operating in response to said first clock signal.

6. The memory circuit of claim 5 wherein said transmission gate includes:

a fifth transistor having a gate, a drain and a source, said gate receiving said first clock signal, said source being coupled to said drain of said fourth transistor, said drain being coupled to said gate of said first transistor; and a sixth transistor having a gate, a drain and a source, said gate receiving a second clock signal of opposite phase from said first clock signal, said drain being coupled to said drain of said fourth transistor, said source being coupled to said gate of said first transistor.

7. A memory circuit responsive to an address signal for retrieving a differential data signal, comprising:

an amplifier having first and second inputs coupled for receiving the differential data signal and having first and second outputs for providing an amplified differential data signal at first and second nodes, said first amplifier operating during a first state of a first clock signal applied at an enable input;

a differential to single-ended converter having first and second inputs and an output, said first input being coupled to said first node, said second input being coupled to said second node, said output providing a digital output signal of the memory circuit; and a latching circuit having an input and an output, said input being coupled to said output of said differential to single-ended converter for latching said digital output signal in response to a second state of said first clock signal, said output being coupled to said output of said differential to single-ended converter for providing substantially zero delay in latching said digital output signal.

8. The memory circuit of claim 7 further including circuit means coupled to said first and second nodes for driving said amplified differential data signal to an equilibrium voltage level at said first and second nodes during a second state of said first clock signal.

9. The memory circuit of claim 8 wherein said latching circuit includes:

a first inverter having an input coupled to said output of said differential to single-ended converter and having an output;

a second inverter having an input coupled to said output of said first inverter and having an output; and a transmission gate coupled between said output of said second inverter and said input of said first inverter and operating in response to said first clock signal.

10. The memory circuit of claim 9 wherein said first inverter includes:

a first transistor having a gate, a drain and a source, said gate being coupled to said output of said differential to single-ended converter, said source being coupled to a first power supply conductor; and a second transistor having a gate, a drain and a source, said gate being coupled to said gate of said first transistor, said drain being coupled to said drain of said first transistor, said source being coupled to a second power supply conductor.

11. The memory circuit of claim 10 wherein said second inverter includes:

a third transistor having a gate, a drain and a source, said gate being coupled to said output of said first inverter, said source being coupled to said first power supply conductor; and a fourth transistor having a gate, a drain and a source, said gate being coupled to said output of said first inverter, said drain being coupled to said drain of said third transistor, said source being coupled to said second power supply conductor.

12. The memory circuit of claim 11 wherein said transmission gate includes:

a fifth transistor having a gate, a drain and a source, said gate receiving said first clock signal, said source being coupled to said output of said second inverter, said drain being coupled to said input of said first inverter; and a sixth transistor having a gate, a drain and a source, said gate receiving a second clock signal of opposite phase from said first clock signal, said drain being coupled to said output of said second inverter, said source being coupled to said input of said first inverter.

13. The memory circuit of claim 12 wherein said circuit means includes:

a seventh transistor having a gate, a drain and a source, said gate receiving said first clock signal, said source being coupled to said first power supply conductor, said drain being coupled to said first node; and an eighth transistor having a gate, a drain and a source, said gate receiving said first clock signal, said source being coupled to said first power supply conductor, said drain being coupled to said second node.

14. A memory circuit responsive to an address signal for retrieving a differential data signal, comprising:

an amplifier having first and second inputs coupled for receiving the differential data signal and first and second outputs for providing an amplified differential data signal at first and second nodes, said first amplifier operating during a first state of a first clock signal applied at an enable input;

circuit means coupled to said first and second nodes for driving said amplified differential data signal to an equilibrium voltage level at said first and second nodes during a second state of said first clock signal;

a differential to single-ended converter having first and second inputs and an output, said first input being coupled to said first node, said second input being coupled to said second node, said output providing a digital output signal of the memory circuit;

a first inverter having an input coupled to said output of said differential to single-ended converter and having an output;

a second inverter having an input coupled to said output of said first inverter and having an output; and a transmission gate coupled between said output of said second inverter and said input of said first inverter and operating in response to said first clock signal for providing substantially zero delay in latching said digital output signal.

15. The memory circuit of claim 14 wherein said differential to single-ended converter includes:

a first transistor having a gate, a drain and a source, said gate being coupled to said first node, said source being coupled to a first power supply conductor;

a second transistor having a gate, a drain and a source, said gate being coupled to said second node, said source being coupled to said first power supply conductor;

a third transistor having a gate, a drain and a source, said gate and drain being coupled together to said drain of said second transistor, said source being coupled to a second power supply conductor; and a fourth transistor having a gate, a drain and a source, said gate being coupled to said gate of said third transistor, said source being coupled to said second power supply conductor, said drain being coupled to said drain of said first transistor for providing said digital output signal.

16. The memory circuit of claim 15 wherein said circuit means includes:

a fifth transistor having a gate, a drain and a source, said gate receiving said first clock signal, said source being coupled to said first power supply conductor, said drain being coupled to said first node; and a sixth transistor having a gate, a drain and a source, said gate receiving said first clock signal, said source being coupled to said first power supply conductor, said drain being coupled to said second node.

17. The memory circuit of claim 14 wherein said first inverter includes:

a first transistor having a gate, a drain and a source, said gate being coupled to said output of said differential to single-ended converter, said source being coupled to a first power supply conductor; and a second transistor having a gate, a drain and a source, said gate being coupled to said gate of said first transistor, said drain being coupled to said drain of said first transistor, said source being coupled to a second power supply conductor.

18. The memory circuit of claim 17 wherein said transmission gate includes:

a fifth transistor having a gate, a drain and a source, said gate receiving said first clock signal, said source being coupled to said drain of said fourth transistor, said drain being coupled to said gate of said first transistor; and a sixth transistor having a gate, a drain and a source, said gate receiving said second clock signal, said drain being coupled to said drain of said fourth transistor, said source being coupled to said gate of said first transistor.

19. The memory circuit of claim 17 wherein said second inverter includes:

a third transistor having a gate, a drain and a source, said gate being coupled to said drain of said first transistor, said source being coupled to said first power supply conductor; and a fourth transistor having a gate, a drain and a source, said gate being coupled to said gate of said third transistor, said drain being coupled to said drain of said third transistor, said source being coupled to said second power supply conductor.

* * * * *

UNITED STATES PATENT AND TRADEMARK OFFICE
CERTIFICATE OF CORRECTION

PATENT NO. : 5,289,415  Page 1 of 2
APPLICATION NO. : 07/870074
DATED : February 22, 1994
INVENTOR(S) : David DiMarco et al.

It is certified that error appears in the above-identified patent and that said Letters Patent is hereby corrected as shown below:

In the Drawing

In the sole Figure, reverse the clock signals connected to the gates of transistors 60 and 62, and the Title page showing illustrative Figure should be deleted and replace with the attached title page.

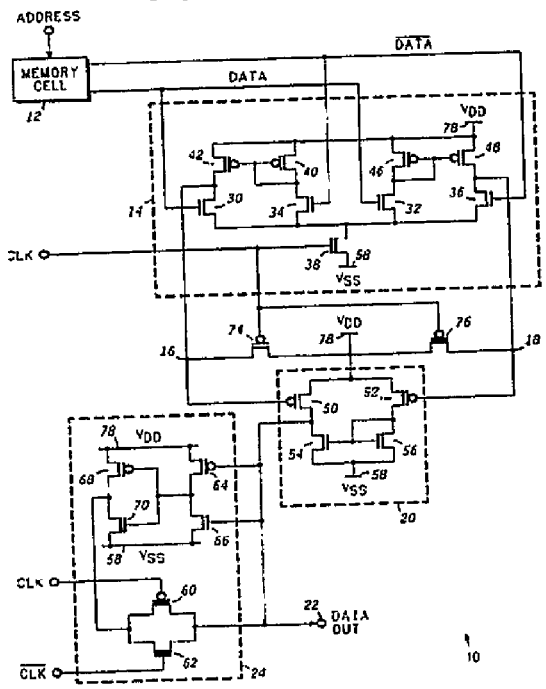

Signed and Sealed this

Twenty-ninth Day of May, 2007

JON W. DUDAS
*Director of the United States Patent and Trademark Office*

United States Patent [19]
DiMarco et al.

[11] Patent Number: 5,289,415
[45] Date of Patent: Feb. 22, 1994

[54] SENSE AMPLIFIER AND LATCHING CIRCUIT FOR AN SRAM

[75] Inventors: David P. DiMarco, Chandler; James W. Nicholes, Gilbert; Douglas D. Smith, Mesa, all of Ariz.

[73] Assignee: Motorola, Inc., Schaumburg, Ill.

[21] Appl. No.: 870,074

[22] Filed: Apr. 17, 1992

[51] Int. Cl.$^5$ .................... G11C 7/00; G11C 7/02; G11C 11/00

[52] U.S. Cl. .................... 365/190; 365/154; 365/203; 365/208

[58] Field of Search ............ 365/190, 203, 207, 154, 365/208

[56] References Cited

U.S. PATENT DOCUMENTS

| | | | |
|---|---|---|---|
| 4,542,483 | 9/1985 | Procyk | 365/190 |
| 4,750,155 | 6/1988 | Hsieh | 365/154 |
| 4,954,992 | 9/1990 | Kumanoya et al. | 365/207 |
| 5,007,024 | 4/1991 | Tanaka et al. | 365/207 |
| 5,065,363 | 11/1991 | Sato et al. | 365/154 |
| 5,126,974 | 6/1992 | Sasaki et al. | 365/207 |
| 5,153,459 | 10/1992 | Park et al. | 365/190 |

Primary Examiner—Eugene R. LaRoche
Assistant Examiner—Michael C. Kessell
Attorney, Agent, or Firm—Robert D. Atkins

[57] ABSTRACT

A memory circuit uses sense amplifiers to amplify a low level differential data signal from the memory cells to full logic levels. A first sense amplifier converts the low level differential data signal to an intermediate differential voltage level at first and second nodes during the read cycle. A second sense amplifier converts the intermediate differential voltage level to the full logic level. The first and second sense amplifiers are powered down after sensing is complete. A circuit drives the intermediate differential data signal to an equilibrium voltage level when the sensing is complete to reduce the power up delay time of the second sense amplifier and thereby increase the operating speed of the memory circuit. A latching circuit is synchronized with the power down of the first sense amplifier to latch the output logic level at the end of the read cycle.

19 Claims, 1 Drawing Sheet